United States Patent [19]

Shannon

[11] Patent Number: 4,561,005
[45] Date of Patent: Dec. 24, 1985

[54] SOLID-STATE INFRARED RADIATION IMAGING DEVICES HAVING A RADIATION-SENSITIVE PORTION WITH A SUPERLATTICE STRUCTURE

[75] Inventor: John M. Shannon, Whyteleafe, England

[73] Assignee: U.S. Philips Corporation, New York, N.Y.

[21] Appl. No.: 625,413

[22] Filed: Jun. 28, 1984

Related U.S. Application Data

[63] Continuation of Ser. No. 411,730, Aug. 28, 1982, abandoned.

[30] Foreign Application Priority Data

Sep. 18, 1981 [GB] United Kingdom ............... 8128310

[51] Int. Cl.[4] ..................... H01L 29/78; H01L 27/14; H01L 31/00
[52] U.S. Cl. ......................................... 357/24; 357/4; 357/30; 357/88
[58] Field of Search ................... 357/4, 24 M, 24 LR, 357/30, 88

[56] References Cited

U.S. PATENT DOCUMENTS

| | | | |
|---|---|---|---|
| 3,626,257 | 12/1971 | Esaki et al. | 357/4 |
| 3,626,328 | 12/1971 | Esaki et al. | 357/4 |
| 3,882,533 | 5/1975 | Dohler | 357/58 |
| 4,210,922 | 7/1980 | Shannon | 357/24 M |
| 4,258,376 | 3/1981 | Shannon | 357/24 M |
| 4,348,686 | 9/1982 | Esaki et al. | 357/30 |

OTHER PUBLICATIONS

Esaki, L. et al., "Superlattice and Negative Differential Conductivity in Semiconductors", IBM Journal of Research and Development, vol. 14, No. 61, pp. 61-65, (Jan. 1970).

Primary Examiner—Gene M. Munson
Attorney, Agent, or Firm—Marc D. Schechter

[57] ABSTRACT

An infrared radiation imaging device comprises a semiconductor body (1), for example of silicon, having a radiation-sensitive portion (2) in which charge-carriers (24) are generated on absorption of infrared radiation (4). The semiconductor body also includes a signal-processing portion in which the charge-carriers (24) are collected in a charge-transfer shift register, for example a surface-channel or buried-channel CCD. An electrical signal representative of the detected radiation is produced at an output (10) of the shift register. At least the radiation-sensitive portion (2) is depleted of free charge-carriers in the absence of the radiation (4). The semiconductor material of the signal-processing portion (3) has an energy band gap ($E_g$) which is greater than the quantum energy of the detected infrared radiation (4). The radiation-sensitive portion (2) is of the same semiconductor material as the signal-processing portion (3) but comprises a plurality of alternating n-type and p-type layers. These layers form an energy band bending superlattice structure locally in the body (1) with a reduced effective band gap ($E_g'$). The n-type and p-type layers have a doping concentration and thickness such that the superlattice structure can be depleted through its thickness without producing breakdown. The charge-carriers (24) are generated in the superlattice structure by transitions across the effective band gap ($E_g'$) between the conduction and valence bands of the semiconductor material of the radiation-sensitive portion (2).

20 Claims, 3 Drawing Figures

SOLID-STATE INFRARED RADIATION IMAGING DEVICES HAVING A RADIATION-SENSITIVE PORTION WITH A SUPERLATTICE STRUCTURE

This is a continuation of application Ser. No. 411,730, filed Aug. 28, 1982, now abandoned.

BACKGROUND OF THE INVENTION

The invention relates to infrared radiation imaging devices. More particularly, the invention relates to a radiation imaging device comprising a charge-transfer shift register. The shift register may be, exclusively be a silicon charge-coupled device.

U.S. Pat. No. 4,210,922 corresponding to U.K. Patent Specification No. 1,564,107) describes an infrared radiation imaging device. The device comprises a semiconductor body having a radiation-sensitive portion in which charge-carriers are generated on absorption of infrared radiation incident on the device. The device further comprises a signal-processing portion having a charge-transfer shift register. In the charge transfer shift register, the radiation-generated charge-carriers are collected and transported to an output. An electrical signal representative of the detected radiation appears at the output.

The semiconductor material of the signal-processing portion has an energy band gap which is greater than the quantum energy of the detected infrared radiation. Means are present for depleting at least the radiation-sensitive portion of the semiconductor body free charge-carriers in the absence of the radiation. The radiation-sensitive portion is of the same semiconductor material as the signal-processing portion.

The imaging devices described in U.S. Pat. No. 4,210,922 are charge-coupled devices. It is advantageous to use a common silicon body for both the CCD signal-processing portion and the radiation-sensitive portion. Both the radiation-sensitive portion and the signal-processing portion have an energy band gap which is greater than the quantum energy of the detected infrared radiation. The radiation-sensitive portion is formed by providing at least a portion of the silicon body with a concentration of at least one deep-level impurity which provides centers for trapping majority charge-carriers which can be released upon excitation by infrared radiation in a given wavelength range. Therefore, the quantum efficiency of the device is dependent on the number of majority carriers trapped at deep-level centers. The body must be cooled to low temperatures to prevent significant thermal excitation of the centers.

In order to obtain a high detectivity with this known device having deep-level centers, a very large number of centers is desired in the radiation-sensitive portion, for example up to $10^{16}$ centers per $cm^2$. The centers may be formed by doping the body portion with, for example, indium, thallium, gallium or sulphur, or by introducing defect levels by radiation damage to the silicon lattice, for example using proton bombardment.

In practice such high concentrations of centers may be difficult to achieve in a thin layer, for example because of solid solubility limitations. Such high concentrations may also interfere with characteristics of the signal-processing portion, for example the CCD charge transfer characteristics.

With such high concentrations of centers the radiation-sensitive portion can be depleted of free charge-carriers without breakdown only if substantially all of the deep-level centers within the depletion region are full of majority charge-carriers. If the charge state of a substantial fraction of the deep-level centers is changed in the depletion regions, then breakdown would occur. This limits the integration period for the device, i.e. the period in which the maximum radiation can be incident on a particular imaging elemental portion of the device before it becomes necessary to replenish the centers with majority carriers by refreshing. In practice with a silicon device this can limit the number of centers which may change charge state to, for example, not more than $10^{12}$ per $cm^2$ in the integration period.

SUMMARY OF THE INVENTION

According to the present invention an infrared radiation imaging device comprises a semiconductor body. The semiconductor body has a radiation-sensitive portion, in which charge-carriers are generated on absorption of infrared radiation incident on the device, and a signal-processing portion, having a charge-transfer shift-register in which the radiation-generated charge-carriers are collected and are transported to an output an electrical signal representative of the detected radiation is produced at the output. The semiconductor material of the signal-processing portion has an energy band gap which is greater than the quantum energy of the detected infrared radiation. The infrared radiation imaging device also includes means for depleting at least the radiation-sensitive portion of free charge-carriers in the absence of the semiconductor body of the radiation. The radiation-sensitive portion is made of the same semiconductor material as the signal-processing portion.

According to the invention, the radiation-sensitive portion comprises a plurality of alternating n-type and p-type layers. These layers locally form an energy-band-bending superlattice structure in the body with a reduced effective band gap. The n-type and p-type layers have a doping concentration and thickness such that the superlattice structure can be depleted through its thickness without experiencing breakdown. The charge-carriers are generated in the superlattice structure by excitation across the effective band gap of the semiconductor material of the radiation-sensitive portion.

Such an imaging device according to the invention retains the advantages of forming the radiation-sensitive and signal-processing portions in a common semiconductor body of the same semiconductor material, for example silicon. At the same time, it avoids the disadvantages of using a high concentration of deep-level centers for the radiation-sensitive portion. The charge-carriers generated by the radiation result from excitation across the effective band gap between the conduction and valence bands. A high quantum efficiency and high detectivity can thus be obtained, and in general less cooling of the device (to prevent significant thermal generation of carriers by such transitions) will be necessary. Furthermore, the radiation-sensitive portion can be very thin (e.g. less than 0.5 micrometers for the total thickness of the superlattice structure) so that cross talk between detecting elements of the imaging device can be reduced.

The reduced effective bandgap in the radiation-sensitive portion of the body results from the Brillouin zone associated with the actual semiconductor lattice of the body material. The Brillouin zone is divided into smaller zones (so-called "mini-zones") which are formed in momentum space (wave vector space) by the spatially alternating potential variation associated with the alternating conductivity-type layer structure of the radiation-sensitive portion. The formation of a superlattice structure by such division of the Brillouin zone is described in U.S. Pat. Nos. 3,626,257 and 3,636,328 and in the article entitled "Superlattice and Negative Differential Conductivity in Semiconductors" by L. Esaki et al. (IBM Journal Research Development Volume 14, No. 61, January 1970, pages 61 to 65). However the effective band gap can also be reduced by band-gap tunnelling of the charge-carriers between adjacent layers in the superlattice structure.

The signal-processing portion may comprise a semiconductor layer of one conductivity type which extends above the radiation-sensitive portion formed by the superlattice structure. The charge-transfer shift-register may comprise electrode means present on the semiconductor layer. The electrode means capacitively produce electric fields in the semiconductor layer by means of which charge-carriers generated in the superlattice structure by the infrared radiation can be introduced into the semiconductor layer of the one conductivity type and transported to the output to provide the electrical signal. One advantage of this arrangement is that the signal processing portion and its electrode means can be optimized for charge-transfer, while the radiation-sensitive portion can be provided in a compact three-dimensional arrangement to make efficient use of the surface area of the semiconductor body. However other arrangements are possible In another form of device according to the invention, the signal-processing portion and radiation-sensitive portion may be provided side-by-side in the semiconductor body.

DESCRIPTION OF THE PREFERRED EMBODIMENTS

Figure 1:
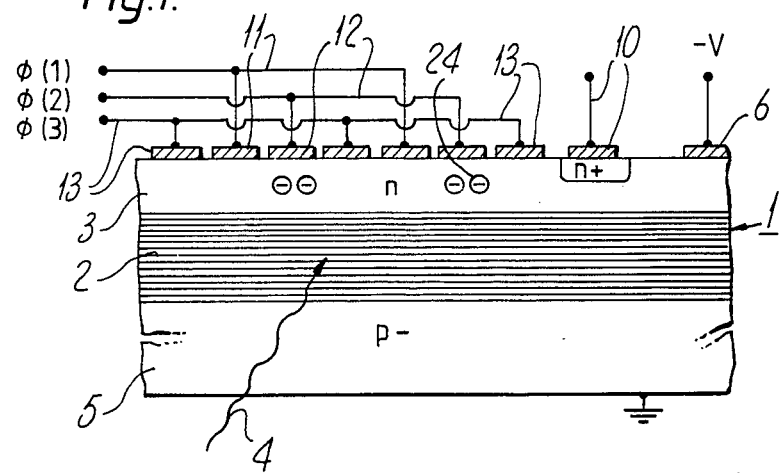
FIG. 1 is a schematic cross-sectional view of part of an infrared radiation imaging device according to the present invention having a buried-channel CCD signal-processing portion.

It should be noted that all of the Figures are schematic and not drawn to scale. The relative dimensions and proportions of some parts of these Figures (particularly the thickness) have been shown exaggerated or reduced for the sake of clarity and convenience in the drawing. The same reference numerals used in one embodiment are generally used to refer to corresponding or similar parts in the other embodiments.

Figure 2:
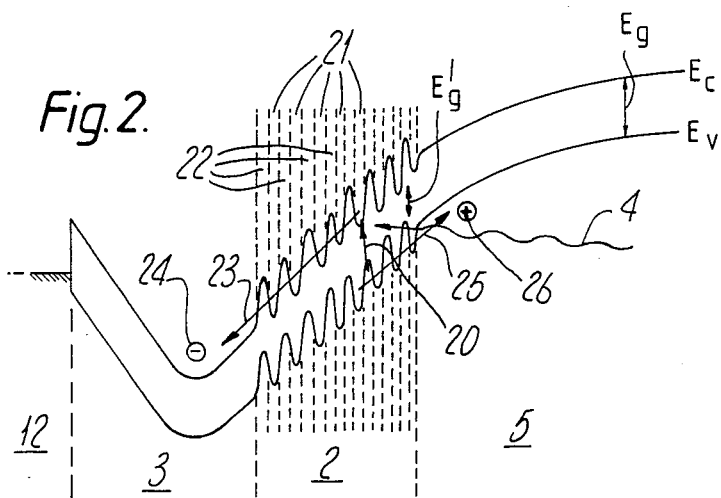
FIG. 2 is an energy band diagram through the thickness of both the signal-processing and radiation-sensitive portions of the device of FIG. 1.

The infrared radiation imaging device of FIGS. 1 and 2 comprises a monocrystalline silicon semiconductor body 1 having a radiation-sensitive portion 2 and a signal-processing portion 3. Infrared radiation 4 in a given wavelength range is imaged onto the device and penetrates to the radiation-sensitive portion 2, where absorption occurs generating free charge-carriers 24. The radiation-generated charge-carriers 24 are collected in the signal-processing portion 3, from which an electrical signal representative of the detected radiation image is derived at an output electrode 10.

As described below, the signal processing portion of the device of FIGS. 1 and 2 is organized into a buried-channel charge-coupled device having CCD electrodes 11, 12 and 13.

Both the body portions 2 and 3 are of silicon. The energy band gap $E_g$ of silicon is approximately 1.1 eV which is greater than the quantum energy of the infrared radiation which it is desired to detect. For example, the quantum energy of radiation having a wavelength above 3 micrometers is at most approximately 0.4 eV, and a wavelength of, for example, 12 micrometers corresponds to a quantum energy of approximately 0.1 eV.

The silicon body portion 2 is constructed, according to the present invention to have a reduced effective band gap so as to be sensitive to infrared radiation having a quantum energy which is less than 1.1 eV. Thus, the radiation-sensitive portion 2 comprises a plurality of alternating n-type and p-type layers 21 and 22 (see FIG. 2). These layers form an energy-band-bending superlattice structure locally in the body 1. The alternating layers 21 and 22 are sufficiently thin and highly-doped to introduce a spatially periodic potential variation over distances comparable with the electron wavelength in the semiconductor material. This changes the electrical and optical properties of the material. In particular an effective energy band gap $E_g'$ of less than 1.1 eV is obtained between the valence and conduction band edges $E_v$ and $E_o$ even though the body portion 2 is of silicon. This is illustrated schematically in FIG. 2.

The choice of the doping concentration and thickness of each n-type and p-type layer 21 and 22 determines the effective band-gap $E_g'$, and hence determines the maximum radiation wavelength which will produce electron-hole pairs by excitation across the effective band gap $E_g'$ on absorption in the body portion 2. Such transitions between the conduction and valence bands are illustrated by the arrow 20 in FIG. 2.

In one particular example for imaging infrared radiation 4 in the 8 to 14 micrometers atmospheric window, each n-type layer 21 may have a doping concentration of about $10^{20}$ donor atoms per $cm^3$ and a thickness of about 2 nm (20 Å). Each p-type layer may have a doping concentration of about $10^{20}$ acceptor atoms per $cm^3$ and a thickness of about 3 nm (30 Å). The total number of layers 21 and 22 must be sufficient to provide the energy-band-bending superlattice structure and also to prevent an adequately thick body portion 2 for the absorption of the radiation 4. For imaging radiation having a wavelength between 8 and 14 micrometers, the total number of layers 21 and 22 may be 40 to 50 so that the radiation-sensitive portion 2 (having the reduced effective band-gap $E_g'$) is approximately 0.1 micrometers ($10^3$ Å) thick. This very small thickness of the portion 2 reduces cross talk between the detecting elements. For the sake of clarity and convenience, not all these layers 21 and 22 are shown in FIG. 1.

Furthermore, the doping concentration and thickness of each layer 21 and 22 is such that the superlattice structure of the body portion 2 can be depleted throughout its thickness without experiencing breakdown. By controlling the thicknesses and doping concentrations, the positive and negative charge-states of the depleted layers 21 and 22, respectively, are balanced across the whole superlattice structure. Any cumulative imbalance in charge across the whole depleted superlattice structure totals less than the critical charge level for avalanche breakdown.

The signal-processing portion 3 is a portion of an epitaxial semiconductor layer of one conductivity type (n-type in the example given in FIGS. 1 and 2) which extends above the radiation-sensitive portion 2. The energy band gap $E_g$ of the silicon material of this layer is unmodified by its doping and so is approximately 1.1 eV.

The radiation-sensitive portion 2 formed by the superlattice structure is present on a substrate 5. In the form illustrated in FIGS. 1 and 2, the substrate is a lightly doped region of the silicon body 1. The substrate has an unmodified energy band gap $E_g$ of approximately 1.1 eV, and it is of the opposite conductivity type (p-type in the example given in FIGS. 1 and 2) with a doping concentration of, for example, $10^{15}$ acceptor atoms per cm$^3$.

The superlattice structure can be formed on the substrate 5 using known molecular beam epitaxial techniques to permit good control of the individual thicknesses and doping concentrations of each thin layer 21 and 22. The much thicker layer (which provides the portion 3) can be formed subsequently on the superlattice structure also by using epitaxial techniques. The more highly doped n-type zone (n+) which is contacted by the output electrode 10 can be formed by ion implantation using either a low temperature or pulsed laser-beam for annealing.

The signal-processing layer portion 3 is laterally isolated in the epitaxial layer by reverse-biasing a Schottky barrier between the n-type layer and a Schottky electrode 6 which extends on the layer surface around the periphery of the CCD island portion 3. Only a part of the portion 3 and isolation electrode 6 adjacent the output electrode 10 is shown in FIG. 1.

A reverse-bias voltage is applied between the opposite conductivity type substrate 5 and layer portion 3 so as to form a depletion layer which fully depletes the body portions 2 and 3 in the absence of incident radiation 4. The thickness and doping concentration of the layer portion 3 may be, for example, 2.5 micrometers and $2 \times 10^{15}$ atoms per cm$^3$, so that when fully depleted its charge level is approximately $5 \times 10^{11}$ cm$^{-2}$. This is below the critical charge level for avalanche breakdown. The depleted layer portion 3 provides the charge-transfer channel portion of a buried-channel charge-coupled device.

Electrodes 11, 12 and 13, which are present on the layer 3, form a sequence of gates. These gates are arranged for CCD operation in known manner. By applying appropriate clocking voltages $\phi(1)$, $\phi(2)$, and $\phi(3)$ to the CCD electrodes 11, 12, 13, electric fields are capacitively produced in the layer portion 3. By means of these fields charge-carriers 24 (generated in the superlattice structure 2 by the radiation 4) can be introduced into the layer portion 3 and can be transported in discrete-packets to charge-reading means at the electrode 10. The charge packets provide the output signal.

In the form illustrated in FIG. 1 the CCD electrode means are a sequence of three Schottky gates 11, 12 and 13 provided by metal or metal-silicide layers which form Schottky barriers with the surface of the silicon layer portion 3. In operation these Schottky barriers are reverse-biased.

An advantage of Schottky gates is that the electrode means can be formed using low temperature technology, which will not adversely modify the doping distribution and thicknesses of the previously-formed underlying layers 21 and 22 of the superlattice structure. However, the CCD electrode means may be in the form of conductive semiconductor or metal layers which are separated from the underlying silicon layer portion 3 by an insulating dielectric layer, to form insulated gates. Such an insulating layer may be formed in known manner by a low temperature deposition process or by plasma oxidation. Furthermore, although a 3-phase CCD structure is illustrated in FIG. 1, the signal-processing may be effected with other arrangements, for example a 2-phase or 4-phase CCD arrangement.

The imaging device of FIGS. 1 and 2 may be operated at a temperature of, for example, 77° K. or higher, depending on the radiation to be detected. The radiation 4 may be imaged onto the device body 1 via any known appropriate infrared lens system.

The image may be formed on the back surface of substrate 5.

The radiation 4 is absorbed in the radiation-sensitive superlattice portion 2 where it generates electron-hole pairs 24 and 26. Because these electron-hole pairs are generated by transitions 20 between the conduction and valence bands, the quantum efficiency and detectivity of this device according to the invention can be much higher than for the known deep-level impurity CCD imaging devices of U.S. Pat. No. 4,210,922. Moreover, the quantum efficiency and the detectivity are not limited by the doping concentrations in the radiation-sensitive portion 2.

Under the influence of the applied fields in the body portions 2 and 3 the radiation-generated electrons and holes 24 and 26 move in opposite directions. In the example illustrated in FIGS. 1 and 2, the holes 26 are drained to earth via the p-type substrate 5. The electrons 24 drift to the potential minimum below the nearest appropriately-biased CCD electrode 12, where they collect to form a charge packet. The charge packet is subsequently transferred along the layer portion 3 by CCD action to give an output signal.

It should be noted that both electrons 24 and holes 26 generated inside the superlattice structure 2 by the radiation 4 must each cross a succession of alternate n-type and p-type layers in order to reach the buried-channel layer portion 3 and the substrate 5, respectively. The high doping concentrations and small thicknesses chosen for the individual layers 21 and 22 are important in this respect to permit tunnelling of the electrons and holes 24 and 26 through the potential barriers presented by the individual layers 21 and 22. Such tunnelling of the electrons 24, and holes 26 is illustrated in FIG. 2 by arrows 23 and 25.

The slope of the band edges in the portion 2 of FIG. 2 also illustrates the drift field which results from reverse-biasing the layer portion 3 with respect to the substrate 5. Electrons 24 move toward the layer portion 3 and holes 26 move toward the substrate 5 in this drift field. With layers 21 and 22 having individual thicknesses of 2 and 3 nm and individual doping concentrations of $10^{20}$ per cm$^3$, efficient tunnelling of the electrons 24 and holes 26 occurs, even at the bottom of the potential wells associated with the layers 21 and 22. Because the holes 26 have a higher effective mass than the electrodes 24, the n-type layers 21 are preferably slightly thinner than the p-type layers 22, for example 2 nm instead of 3 nm.

FIGS. 1 and 2 relate to a buried-channel CCD imaging device. However, the present invention is also applicable to imaging devices having other forms of signal processing in the same semiconductor body as the superlattice radiation-sensitive portion 2. Thus, for example, FIG. 3 illustrates part of a surface-channel CCD imaging device according to the present invention.

Figure 3:
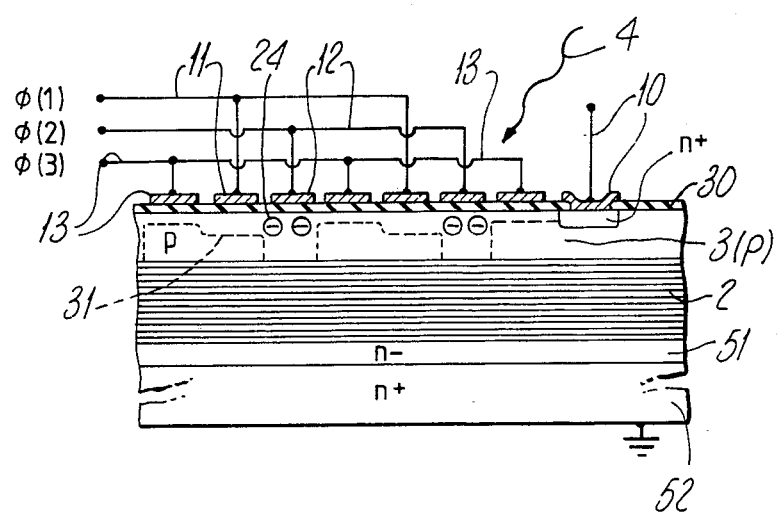
FIG. 3 is a schematic cross-sectional view of part of another infrared radiation imaging device according to the present invention having a surface-channel CCD signal-processing portion.

The superlattice structure of body portion 2 of FIG. 3 corresponds to that of the previous embodiments. The doping concentrations and thicknesses of layers 21 and 22 are chosen to meet the requirements for detecting radiation of a given wavelength, and to permit tunnelling of charge-carriers across a succession of alternate layers 21 and 22 of opposite conductivity types. Furthermore, the superlattice structure can be depleted of free charge-carriers across its whole thickness without avalanche breakdown occurring.

In the surface-channel CCD imaging device of FIG. 3 electron-hole pairs are again generated by absorption of the radiation 4 in the superlattice structure 2 having the reduced band gap. The electrons 24 are collected and transported via the CCD portion 3 to the output electrode 10. In this case the signal-processing portion 3 consists of a p-type epitaxial layer, and the output electrode 10 contacts an opposite-conductivity type region (n+) provided in the p-type layer 3.

The electrons 24 generated in the superlattice can be introduced into the surface-channel CCD by local punch-through of a depletion region to the underlying superlattice radiation-sensitive portion 2 at sites below the individual CCD electrodes 11, 12 and 13, according to the teaching in U.S. Pat. No. 4,258,376 (corresponding to U.K. Patent Specification No. 1,532,859). For this purpose the doping concentrations of both the layer 3 and the superlattice layers 21 and 22 are such that the depletion regions can extend locally through the thickness of both the layer 3 and the superlattice structure 2 without experiencing breakdown. The dotted line 31 in FIG. 3 illustrates the extent of the depletion regions in the layer 3 with punch-through below the electrodes 12.

As illustrated in FIG. 3, all the electrodes 11, 12 and 13 are present on a dielectric layer 30 to form insulated gates of the CCD. By providing transparent electrodes 11, 12, and 13, the radiation 4 may be incident at the surface of the layer portion 3.

The superlattice structure 2 of FIG. 3 is present on a substrate comprising a lightly doped n-type layer 51 on a heavily doped base 52, both of silicon. This substrate 51 and 52 provides an ohmic contact. With no incident radiation 4, the superlattice structure 2 has a high resistance and there is negligible current flow between the substrate 51 and 52 and the punch-through depletion regions (below electrodes 12 in FIG. 3). When the radiation 4 is incident, electron-hole pairs are generated in the superlattice structure 2 and an electron current flows toward the punch-through depletion regions. Electrons are replenished by a current flow from the substrate 51 and 52. The holes generated by the radiation 4 move toward the substrate 51 and 52, and either recombine with electrons from the substrate 51 and 52 or are collected by the substrate 51 and 52. Preferably the signal-processing p-type layer 3 has an ohmic contact electrically connected to the n-type substrate 51 and 52 to permit fast CCD action.

Many other modifications are possible within the scope of the present invention. Thus, for example, the conductivity types of all the semiconductor regions may be reversed to provide an imaging device in which the radiation-generated holes are collected and processed to give an output signal.

Furthemore, the superlattice radiation-sensitive portion 2 need not underlie the signal-processing body portion 3. Instead, the superlattice radiation-sensitive portion 2 may be provided side-by-side in the silicon body 1 with the signal-processing portion 3. In this case, the charge-carriers introduced into the portion 3 from the portion 2 do not need to tunnel through the potential barriers in the superlattice structure; they may merely flow along the length of the individual layers 21 and 22 to a storage site in the body portion 3 below a gating electrode.

I claim:

1. An infrared radiation imaging device comprising a semiconductor body made of a semiconductive material having an energy band gap which is greater than the quantum energy of the infrared radiation forming the infrared image, said semiconductor body comprising:
    a radiation-sensitive portion comprising a plurality of alternating n-type and p-type layers which form an energy-band-bending superlattice structure in the body at the location of the alternating layers, said energy-band-bending superlattice structure having a reduced effective band gap, the alternating n-type and p-type layers having doping concentrations and thicknesses such that they can be depleted throughout their thicknesses without causing breakdown to occur, wherein free charge carriers are generated in the superlattice structure by excitation across the effective band gap on absorption of infrared radiation therein; and
    a signal processing portion having a charge transfer shift register in which the radiation-generated charge carriers are collected and transported to an output, said radiation-generated charge carriers producing an electrical signal representative of the detected radiation at the output.

2. An infrared radiation imaging device as claimed in claim 1, characterized in that the semiconductive material is silicon.

3. An infrared radiation imaging device as claimed in claim 2, characterized in that the alternating n-type and p-type layers have doping concentrations and thicknesses such that the effective band gap is small enough to permit detection of infrared radiation having a wavelength between 8 and 14 micrometers by transitions between the conduction and valence bands in the radiation-sensitive portion.

4. An infrared radiation imaging device as claimed in claim 3, characterized in that the total thickness of the superlattice structure is less than 0.5 micrometers.

5. An infrared radiation imaging device as claimed in claim 1, characterized in that the total thickness of the superlattice structure is less than 0.5 micrometers.

6. An infrared radiation imaging device as claimed in claim 1, characterized in that the device further comprises means for depleting at least the radiation-sensitive portion of free charge carriers in the absence of radiation incident thereon.

7. An infrared radiation imaging device as claimed in claim 6, characterized in that:
    the signal processing portion comprises a semiconductor layer of one conductivity type which extends on top of the radiation-sensitive portion; and
    the charge transfer shift register comprises electrode means on the semiconductor layer for capacitively producing electric fields in the semiconductor layer, said electric fields being for collecting charge carriers generated in the superlattice structure and for transporting the charge carriers to the output.

8. An infrared radiation imaging device as claimed in claim 7, characterized in that the device further comprises a substrate on which the superlattice structure is provided, said substrate comprising a semiconductor layer of a conductivity type opposite that of the signal processing portion.

9. An infrared radiation imaging device as claimed in claim 8, characterized in that:

the signal processing portion and the superlattice structure have doping concentrations and thicknesses such that both can be depleted throughout their thicknesses without causing breakdown to occur; and the electrode means and the semiconductor layer of the signal processing portion form a buried channel charge coupled device in which radiation-generated majority charge carriers are transported through the semiconductor layer.

10. An infrared radiation imaging device as claimed in claim 9, characterized in that the electrode means comprises a sequence of gates which form Schottky barriers with the semiconductor layer of the signal processing portion, said gates being arranged for charge coupled device operation.

11. An infrared radiation imaging device as claimed in claim 8, characterized in that:

the electrode means and the semiconductor layer of the signal processing portion form a surface channel charge coupled device in which the semiconductor layer has a depletion region and in which radiation-generated minority charge carriers are transported through the depletion region of the semiconductor layer; and the signal processing portion and the superlattice structure have doping concentrations such that parts of the depletion region can extend through the thickness of the semiconductor layer of the signal processing portion to the superlattice structure, said depletion region being formed without causing breakdown to occur.

12. An infrared radiation imaging device as claimed in claim 11, characterized in that the semiconductive material is silicon.

13. An infrared radiation imaging device as claimed in claim 12, characterized in that the alternating n-type and p-type layers have doping concentrations and thicknesses such that the effective band gap is small enough to permit detection of infrared radiation having a wavelength between 8 and 14 micrometers by transitions between the conduction and valence bands in the radiation-sensitive portion.

14. An infrared radiation imaging device as claimed in claim 13, characterized in that the total thickness of the superlattice structure is less than 0.5 micrometers.

15. An infrared radiation imaging device as claimed in claim 8, characterized in that the semiconductive material is silicon.

16. An infrared radiation imaging device as claimed in claim 15, characterized in that the alternating n-type and p-type layers have doping concentrations and thicknesses such that the effective band gap is small enough to permit detection of infrared radiation having a wavelength between 8 and 14 micrometers by transitions between the conduction and valence bands in the radiation-sensitive portion.

17. An infrared radiation imaging device as claimed in claim 16, characterized in that the total thickness of the superlattice structure is less than 0.5 micrometers.

18. An infrared radiation imaging device as claimed in claim 7, characterized in that the semiconductive material is silicon.

19. An infrared radiation imaging device as claimed in claim 18, characterized in that the alternating n-type and p-type layers have doping concentrations and thicknesses such that the effective band gap is small enough to permit detection of infrared radiation having a wavelength between 8 and 14 micrometers by transitions between the conduction and valence bands in the radiation-sensitive portion.

20. An infrared radiation imaging device as claimed in claim 19, characterized in that the total thickness of the superlattice structure is less than 0.5 micrometers.

* * * * *